(12) United States Patent
Kim

(10) Patent No.: US 6,534,352 B1
(45) Date of Patent: Mar. 18, 2003

(54) METHOD FOR FABRICATING A MOSFET DEVICE

(75) Inventor: Tae Kyun Kim, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 09/885,083

(22) Filed: Jun. 21, 2001

(30) Foreign Application Priority Data

Jun. 21, 2000 (KR) .......................................... 2000-34317

(51) Int. Cl.[7] .............................................. H01L 21/336

(52) U.S. Cl. ........................ 438/197; 438/259; 438/270; 438/297

(58) Field of Search .......................... 438/197, 270–297, 438/299, 301, 303, 595, 259; 257/344, 330

(56) References Cited

U.S. PATENT DOCUMENTS

6,054,355 A * 4/2000 Inumiya et al. ............. 438/296

* cited by examiner

*Primary Examiner*—Olik Chaudhuri
*Assistant Examiner*—Hsien-Ming Lee
(74) *Attorney, Agent, or Firm*—Pillsbury Winthrop LLP

(57) ABSTRACT

Disclosed is a MOSFET fabrication method capable of forming an ultra shallow junction while ensuring stability in controlling threshold voltage. The disclosed method relies on the use of a sacrificial gate structure to form LDD regions and the addition of side wall spacers to form source/drain regions, followed by the deposition of an interlayer insulating film. The sacrificial gate structure is then removed to form a groove in the interlayer insulating film that exposes a portion of the silicon substrate. A sacrificial oxide is grown on the exposed silicon substrate and impurity ions are implanted through the oxide to adjust the threshold voltage. The sacrificial oxide is then removed and replaced by a high quality gate insulating film. A metal gate electrode is then formed in the groove above the gate insulating film, thereby forming a MOSFET device having a metal gate.

12 Claims, 6 Drawing Sheets

METHOD FOR FABRICATING A MOSFET DEVICE

BACKGROUND OF THE INVENTION

1. Field of the Invention

The present invention relates to a method for fabricating a MOSFET device and, more particularly, to a method for fabricating a MOSFET capable of forming an ultra shallow junction and improving the stability of threshold voltage control.

2. Description of the Related Art

As is well known, gates of MOSFET devices are typically made from polysilicon. This is because polysilicon provides the properties required for gates, for example, high melting point, easy formation of thin films, easy patterning of lines, stability in an oxidizing atmosphere, and suitability for the formation of planarized surfaces. Where such polysilicon gates are employed in MOSFET devices, the resistance is typically lowered by doping the polysilicon with a dopant such as phosphorous (P), arsenic (As), or boron (B).

Meanwhile, the increased degree of integration of MOSFET devices requires corresponding reductions in the values of various parameters, such as the line width of gates, the thickness of gate insulating films, and/or the junction depth in those MOSFET devices. For this reason, where highly integrated MOSFET devices are fabricated using polysilicon gates, it is difficult to achieve the desired low resistance while also achieving the required micro line width. Thus, it is necessary to develop gates made of a material after than doped for polysilicon.

At the early stage of this development, active research and development efforts have been made in connection with polycide gates employing a transition metal-silicide material.

However, such polycide gates are limited in their ability to provide low resistance gates due to the fact that polysilicon still remains in the electrode structure. That is, polycide gates have problems such as increasing the effective thickness of gate insulating film due to a gate depletion effect and introducing variations in the threshold voltage as a result of boron penetration and dopant distribution fluctuations in P$^+$ polysilicon gates.

As a result, active research and development efforts have recently become more focused on metal gates. The metal gates solve the above mentioned problems involved in the polycide gates because they do not use any dopant. Also, where such a metal gate comprises a metal having a work function value corresponding to the mid band-gap of silicon, it can be fabricated into gates usable for both NMOS and PMOS type devices. Metals having a work function value corresponding to the mid band-gap of silicon may include tungsten (W), tungsten nitride (WN), titanium (Ti), titanium nitride (TiN), molybdenum (M), tantalum (Ta), and tantalum nitride (TaN).

Where such a metal gate is actually employed in a MOSFET device, however, it introduces problems associated with the required processing, such as etching difficulties damage generated by plasma during the etching process and ion implantation, and/or thermal damage resulting from thermal processes subsequent to the formation of the gate that tend to degrade device characteristics.

For this reason, it is difficult to form such a metal gate using conventional gate formation processes. To this end, a method has been proposed in which the metal gates are formed using a damascene process. The metal gate formation method using the damascene process involves sequential formation of a transistor including a sacrificial gate made of polysilicon, formation of an interlayer insulating film, removal of the sacrificial gate, deposition of metal film, and a chemical mechanical polishing (CMP) process for the metal film.

Since this metal gate formation method process involves no etching processes, it has advantages of avoiding etch-induced degradation in the characteristics of the device. Moreover, the method can integrated easily into a conventional MOSFET process by selecting the metal suitable for CMP processing.

A conventional MOSFET fabrication method using a damascene process will be described in conjunction with FIGS. 1A to 1H.

Referring to FIG. 1A, a silicon substrate 1 is first prepared which has field oxide films 2 defining an active region. A first thermal oxide film 3 is formed as a screen oxide film on the silicon substrate 1 to cover the active region. Thereafter, desired impurity ions are implanted to control threshold voltage into the silicon substrate 1 through the first thermal oxide film 3.

Referring to FIG. 1B, the first thermal oxide film is removed, and a oxide film 4 is then formed on the silicon substrate 1. A polysilicon film 5 is deposited on the filed oxide film 2 and the oxide film 4. A hard mask film 6 of oxide film or nitride film is then deposited on the polysilicon film 5.

Referring to FIG. 1C, a hard mask pattern 6a is formed by patterning the hard mask film in accordance with a conventional photolithography process. The polysilicon film and the oxide film 4 are then etched using the hard mask pattern 6a as an etch mask to form a sacrificial gate 5a. A gate re-oxidation process is conducted on the resultant structure to remove the etch damage from the silicon substrate 1 and prevent it from further damage during the subsequent implantation process. As a result of this reox process, a second thermal oxide film 11 is formed on the side walls of the sacrificial gate 5a and the exposed surfaces of the silicon substrate 1.

Referring to FIG. 1D, impurity ions having a desired conductivity are implanted in a low concentration into portions of the silicon substrate 1 on opposite sides of the sacrificial gate 5a, thereby forming a lightly doped drain LDD region 12.

Referring to FIG. 1E, the second thermal oxide film is removed. A nitride film is deposited on the entire resultant structure and then the nitride film is blanket etched, thereby forming a spacer 13 on the side walls of the sacrificial gate 5a and the hard mask pattern 6a. Impurity ions having a desired conductivity are then implanted in a high concentration into portions of the silicon substrate on opposite sides of the sacrificial gate 5a including the spacer 13, thereby forming source/drain regions 14.

Referring to FIG. 1F, an interlayer insulating film is deposited on the resultant structure. The interlayer insulating film 15 and the hard mask pattern 6a are polished by employing a CMP process using the sacrificial gate 5a as a polishing stop layer. As a result, the interlayer insulating film 15 is planarized, the hard mask pattern is removed, and the sacrificial gate 5a is exposed.

Referring to FIG. 1G, the exposed sacrificial gate is removed, thereby forming a groove defining a region where a metal gate is to be formed. A gate insulating film 16 is then formed on the resultant structure. A metal film 17 is then deposited to a thickness at least sufficient to fill the groove completely.

Referring to FIG. 1H, a metal gate 20 is then formed by polishing the metal film in accordance with a CMP process using the interlayer insulating film 15 as a polishing stop layer, thereby completing a MOSFET device having a metal gate 20.

However, in accordance with a conventional MOSFET fabrication method, it is difficult to form an ultra shallow junction required in a high integrated MOSFET device. For this reason, it is necessary to use a process technique capable of forming elevated source/drain regions. Moreover, there is a disadvantage that tends to produce unstable MOSFET threshold voltages because the impurity ions implanted for controlling threshold voltage have a varied distribution after the thermal processing.

SUMMARY OF THE INVENTION

Therefore, it is an object of the present invention to provide a MOSFET device fabrication method capable of forming an ultra shallow junction and ensuring the stability of the threshold voltage.

In accordance with the present invention, this object is accomplished by providing a method for fabricating a MOSFET device comprising the steps of preparing a silicon substrate provided with field oxide films; forming a oxide film and a polysilicon film on the silicon substrate; forming a hard mask pattern defining a gate formation region on the polysilicon film; forming a sacrificial gate by etching the polysilicon film and the oxide film using the hard mask pattern as an etch mask; forming a thermal oxide film on the side walls of the sacrificial gate and the exposed surface of silicon substrate by a re-oxidation process; forming LDD regions in the silicon substrate at opposite sides of the sacrificial gate by implanting impurity ions having a desired conductivity using the sacrificial gate as an ion implantation mask; removing the thermal oxide film; forming a spacer on the side walls of the sacrificial gate and the hard mask pattern; forming source/drain regions in portions of silicon substrate on at opposite sides of the sacrificial gate by implanting impurity ions having a desired conductivity using the sacrificial gate and the spacer as an ion implantation mask; depositing an interlayer insulating film on the resultant structure; removing a portion of the interlayer insulating film and the hard mask pattern to expose the sacrificial gate and planarize the structure; removing the exposed sacrificial gate to form a groove exposing that portion of silicon substrate that had been under the sacrificial gate; etching the exposed portion of silicon substrate to a desired thickness; forming a sacrificial oxide film on the etched surface of silicon substrate; implanting impurity ions for controlling threshold voltage into the silicon substrate through the sacrificial oxide film; removing the sacrificial oxide film; forming a gate insulating film on the resultant structure; depositing a desired metal film on the gate insulating film sufficient to fill the groove completely; and forming a metal gate by etching the metal film and the gate insulating film until the interlayer insulating film is exposed.

BRIEF DESCRIPTION OF THE DRAWINGS

The above objects, and other features and advantages of the present invention will become more apparent after reading the following detailed description when taken in conjunction with the drawings, in which.

DETAILED DESCRIPTION OF THE INVENTION

A method for fabricating MOSFET devices in accordance with a preferred embodiment of the present invention will now be described more clearly with reference to FIGS. 2A to 2H.

Figure 1A:
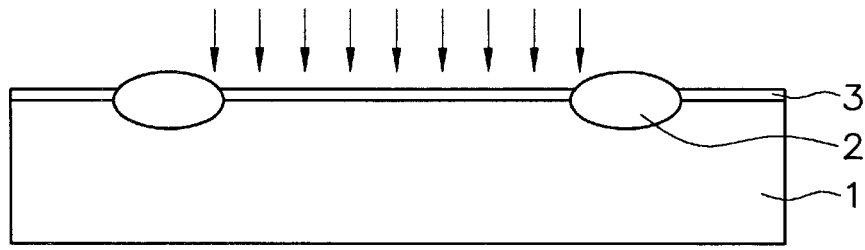
FIGS. 1A to 1H are cross-sectional views respectively illustrating a conventional method for fabricating MOSFET device.
Figure 1B:
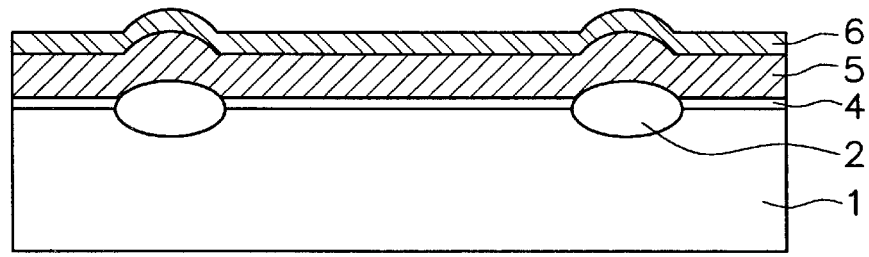
Figure 1C:
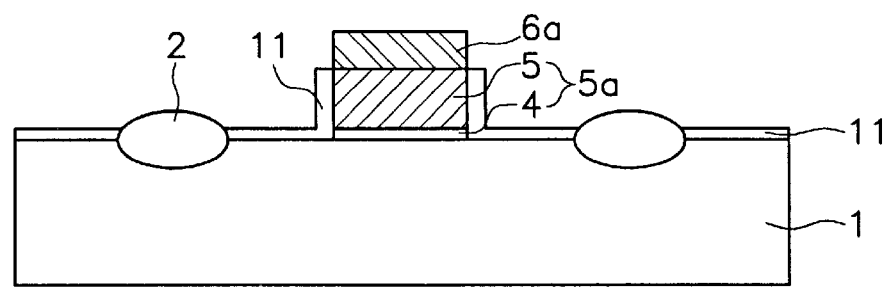
Figure 1D:
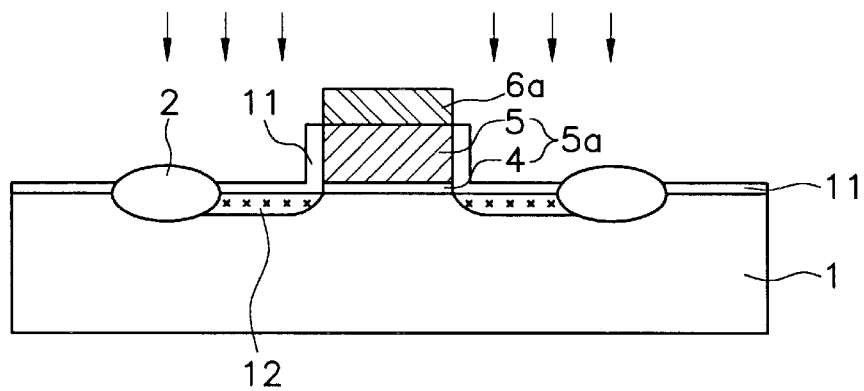
Figure 1E:
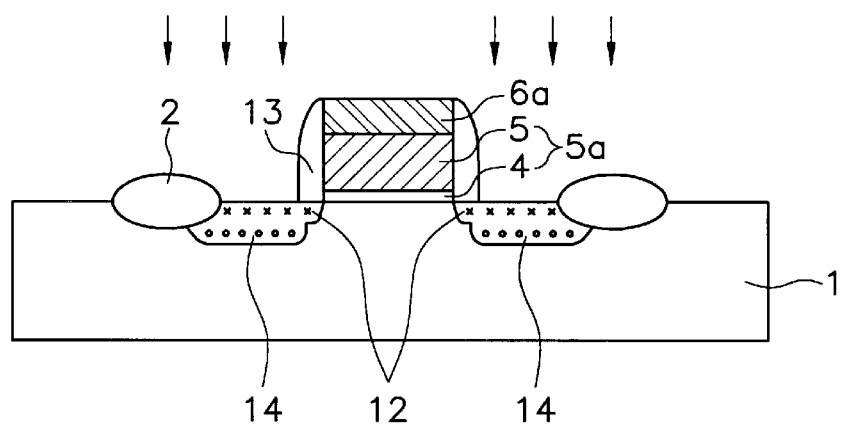
Figure 1F:
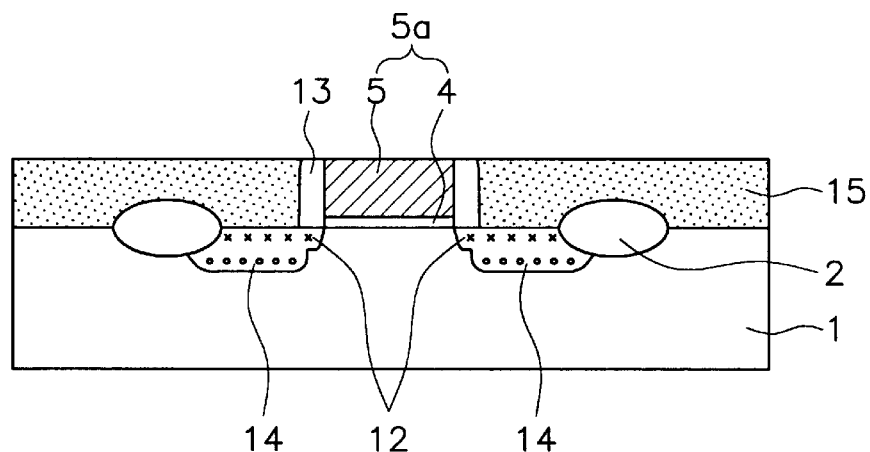
Figure 1G:
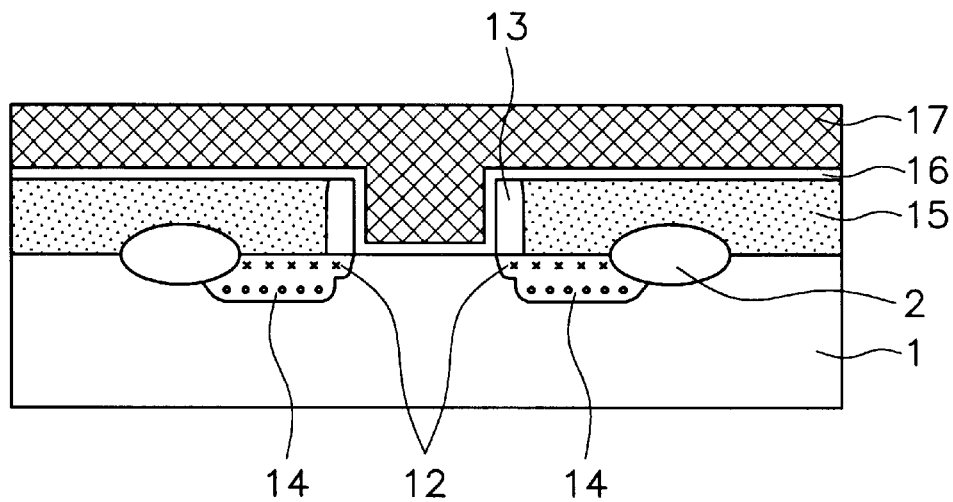
Figure 1H:
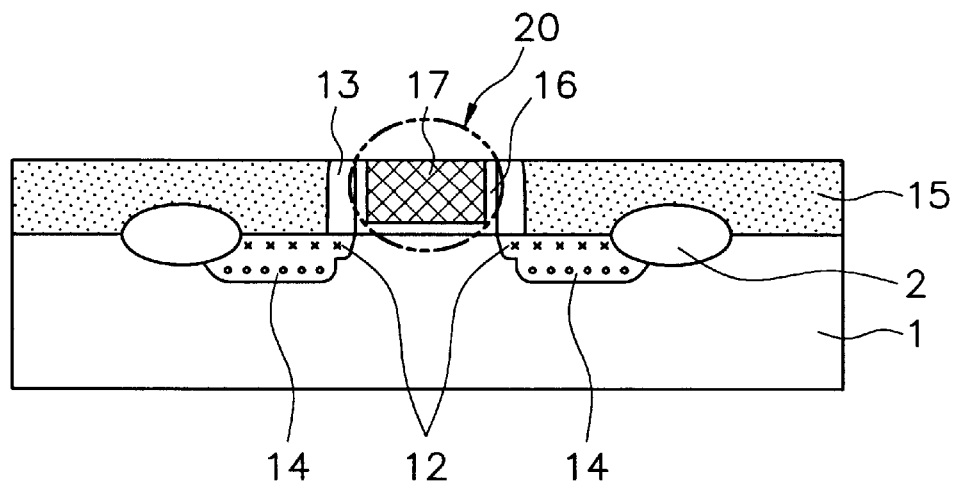
Figure 2A:
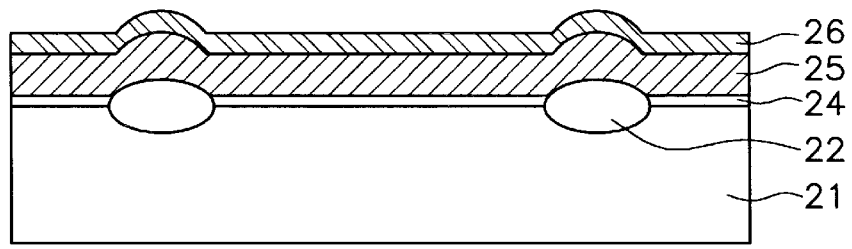
FIGS. 2A to 2H are cross-sectional views respectively illustrating a method for fabricating a MOSFET device in accordance with a preferred embodiment of the present invention.

Referring to FIG. 2A, a silicon substrate 21 provided with field oxide films 22 defining an active region is first prepared and then a oxide film 24 is formed on the active region of the silicon substrate 21. A polysilicon film 25 is deposited to a thickness of 2,000 to 4,000 Å on the oxide film 24 and field oxide film 22 in accordance with a conventional LP-CVD process. A hard mask film 26 made of nitride film or oxide film is then deposited to the thickness of 800 to 1,000 Å on the polysilicon film 25.

Figure 2B:
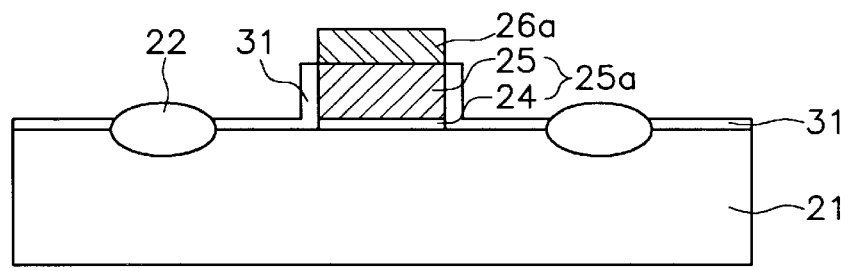

Referring to FIG. 2B, a hard mask pattern 26a is formed by patterning the hard mask film. The polysilicon film 25 and the oxide film 24 are then etched with a conventional etch process using the hard mask pattern 26a as an etch mask to form a sacrificial gate 25a. The resultant structure is then subjected to gate re-oxidation process at the temperature of 650 to 850° C. The gate re-oxidation process is intended to remove damage generated in silicon substrate 21 during the etch process for associated with the formation of sacrificial gate 25a. The reox process is also intended to prevent damage to the silicon substrate 21 during a subsequent ion implantation process for the formation of source/drain regions. As a result of the gate re-oxidation process, a thermal oxide film 31 is formed to the thickness of 30 to 100 Å on the side walls of the sacrificial gate 25a and on the silicon substrate 21. Additionally, by virtue of the gate re-oxidation process, a "bird's beak" structure is induced on the thermal oxide film disposed at the edge of the sacrificial gate 25a, thereby minimizing the creation of gate overlap capacitance.

Figure 2C:
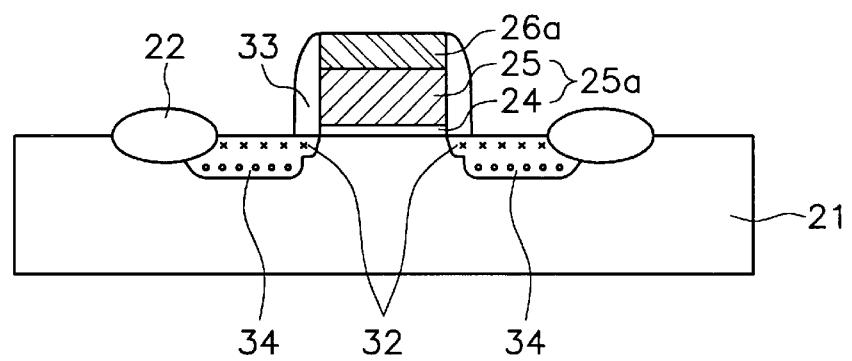

Referring to FIG. 2C, impurity ions having a desired conductivity are implanted in a low concentration into portions of the silicon substrate on opposite sides of the sacrificial gate 25a, thereby forming a LDD regions 32. Thereafter, the thermal oxide film is removed. A nitride film is deposited to the thickness of 900 to 1200 Å on the entire resultant structure and then blanket etched to form spacers 33 on the side walls of the hard mask pattern 26a and the sacrificial gate 25a. Impurity ions having a desired conductivity are then implanted in a high concentration into portions of the silicon substrate on opposite sides of sacrificial gate 25a and the spacer 33 to form source/drain regions 34.

Figure 2D:
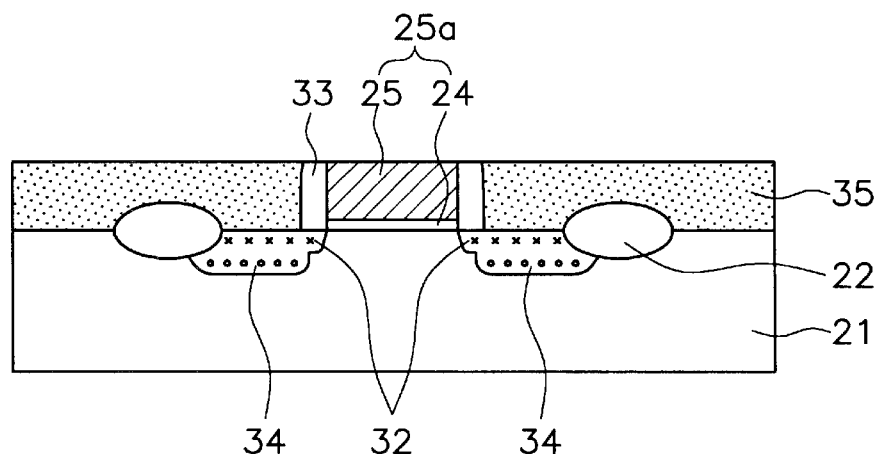

Referring to FIG. 2D, an interlayer insulating film is deposited to the thickness of 4,000 to 6,000 Å on the resultant structure. The interlayer insulating film 35 and the hard mask pattern 26a are then polished in accordance with a CMP process using the sacrificial gate 25a as a polishing stop layer to planarize the interlayer insulating film, remove the hard mask pattern, and expose the sacrificial gate. Here, an etch back process may be substituted for the preferred CMP process.

Figure 2E:
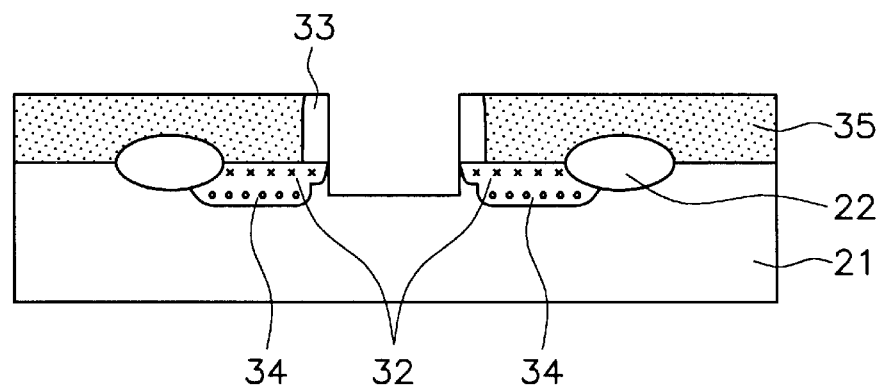

Referring to FIG. 2E, the exposed sacrificial gate are removed with a dry and/or wet etching process(es). Thereafter, a portion of the exposed silicon substrate 21 is etched to remove 300 to 800 Å using a dry etching process.

Figure 2F:
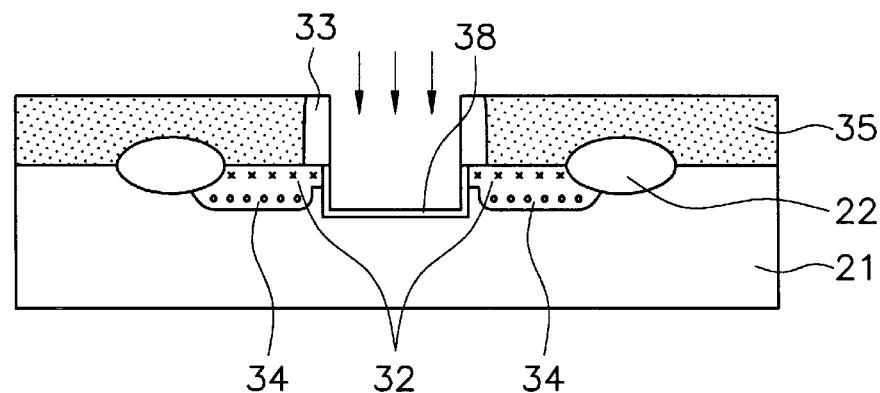

Referring to FIG. 2F, the resultant structure is subjected to a sacrificial oxidation process at the temperature of 600 to 800° C. to form a sacrificial oxide film 38 of 100 to 200 Å on the surface of the silicon substrate 21. Desired impurity ions are then implanted to control threshold voltage into the silicon substrate 21. Here, the sacrificial oxidation process is intended both to remove damage generated during the etching of the silicon substrate 21 and to form a screen oxide film for preventing damage to the silicon substrate 21 when the ions are implanted to adjust the threshold voltage.

Figure 2G:
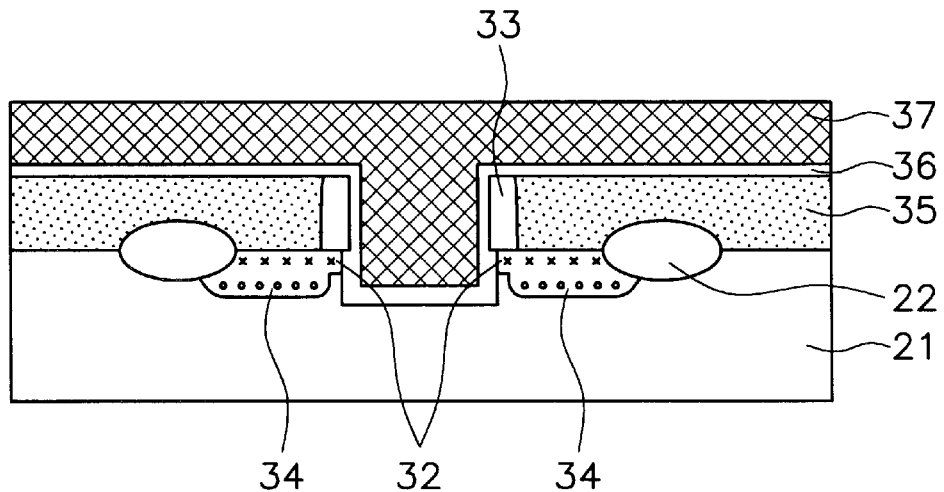

Referring to FIG. 2G, the sacrificial oxide film is removed in accordance with a wet etching process. An additional 50 to 100 Å of the silicon substrate are also removed. A gate insulating film 36 is then formed on the resultant structure and a metal film gates 37 is deposited on the gate insulating film 36. Herein, the gate insulating film 36 is preferably a material selected from a group comprising oxides, oxynitrides, and other high dielectric constant layers having a dielectric constant greater than 15 formed by growth and/or deposition. The metal film for gates 37 is preferably selected from a group comprising W, WN, Ti, TiN, Mo, Ta, and TaN formed using a PVD or CVD process.

Figure 2H:
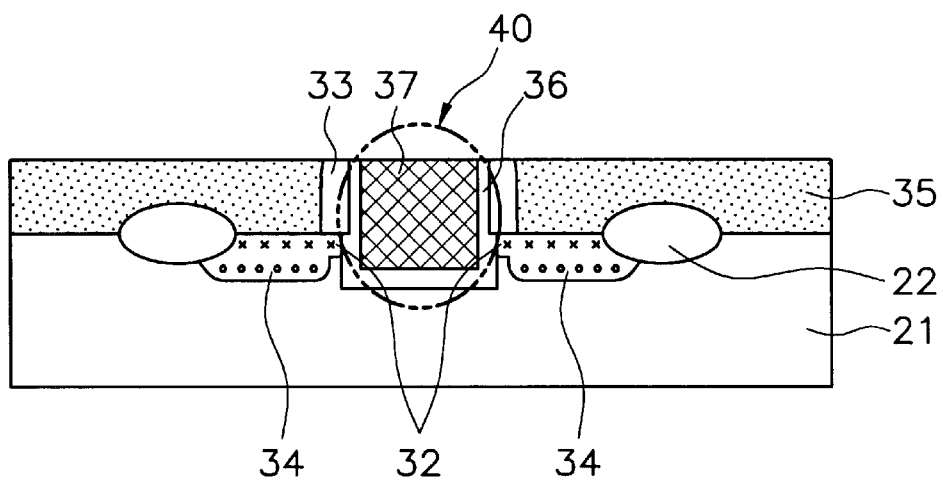

Referring to FIG. 2H, a metal gate 40 is then formed by polishing metal film gate 37 and gate insulating film 36 in accordance with a CMP process using interlayer insulating film 35 as the polishing stop layer to form a MOSFET device. An etch back process can be substituted for the preferred CMP process for forming the metal gate 40.

In accordance with the present invention, the silicon substrate is subjected to a self-aligned etching process after removing the sacrificial gate. The self-aligned etching process includes a dry etching process in which an interlayer insulating film is used as an etch mask, a sacrificial oxidation process, and a wet etching process for removing the sacrificial oxide film. Here, the etch damage to the silicon substrate as a result of the dry etching is removed by the consumption of silicon during the sacrificial oxidation process. Also, an additional etching for the silicon substrate is obtained through removing the sacrificial oxide film formed by the sacrificial oxidation process with the wet etching process.

Therefore, elevated source/drain regions can be formed using a conventional process to form source/drain regions of MOSFET device. Accordingly, an ultra shallow junction can be realized. Also, the thermal budget for the impurity ions is minimized because the threshold voltage control impurity ions are implanted only after formation of the interlayer insulating film. Thus improved stability in threshold voltage control is obtained.

As apparent from the above description, the present invention makes it possible to obtain a ultra shallow junction by employing a self-aligned etching process and threshold voltage control implant only after removing the sacrificial gate. Consequently, this process ensures improved stability in controlling the threshold voltage. As a result, the method for fabricating a MOSFET device in accordance with the present invention provides a device with improved electrical characteristics. Furthermore, the method of the present invention can be advantageously applied to the manufacture of highly integrated devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MOSFET device on a silicon substrate comprising:

forming field oxide regions to define an active region on the silicon substrate provided;

forming a oxide film on the active region;

forming a polysilicon film on the oxide film;

forming a hard mask pattern defining a gate formation region on the polysilicon film;

forming a sacrificial gate by etching the polysilicon film and the oxide film using the hard mask pattern as an etching mask and thereby exposing regions of the silicon substrate;

forming a thermal oxide film on side walls of the sacrificial gate and the exposed regions of the silicon substrate by a re-oxidation process;

implanting impurity ions having a desired conductivity into the silicon substrate using the sacrificial gate as an ion implant mask to form LDD regions in the silicon substrate;

removing the thermal oxide film;

forming a spacer on the side walls of the sacrificial gate and the hard mask pattern;

implanting impurity ions having a desired conductivity into the silicon substrate using the sacrificial gate and the spacers as an ion implantation mask to form source/drain regions in the silicon substrate;

depositing an interlayer insulating film;

removing a portion of the interlayer insulating film and the hard mask pattern to expose an upper surface of the sacrificial gate;

removing the sacrificial gate, thereby forming a groove and exposing that portion of the silicon substrate that had been disposed under the sacrificial gate;

etching the exposed silicon substrate to remove a desired thickness and form an etched silicon substrate;

forming a sacrificial oxide film of a desired thickness on the etched silicon substrate;

implanting a predetermined quantity of impurity ions having a desired conductivity through the sacrificial oxide film and into the silicon substrate to produce a desired threshold voltage;

removing the sacrificial oxide film to expose portions of the etched silicon substrate;

forming a gate insulating film on the exposed portions of the etched silicon substrate;

depositing a metal film, the thickness of the metal film being sufficient to fill the groove; and removing a portion of the metal film to expose a surface of the interlayer insulating film and to form a metal gate in the groove above the gate insulating film.

2. The method according to claim 1, wherein the polysilicon film is deposited to the thickness of 2,000 to 4,000 Å using a LP-CVD process.

3. The method according to claim 1, wherein the hard mask pattern is formed to the thickness of 800 to 1,000 Å.

4. The method according to claim 1, wherein the re-oxidation process is conducted at the temperature of about 650 to 850° C.

5. The method according to claim 1, wherein the re-oxidation process is conducted to form a thermal oxide film having the thickness of about 30 to 100 Å.

6. The method according to claim 1, wherein the interlayer insulating film is deposited to the thickness of 4,000 to 6,000 Å.

7. The method according to claim 1, wherein a thickness of about 300 to 800 Å of the exposed silicon substrate is removed by the etching process.

8. The method according to claim 1, wherein the forming of the sacrificial oxide film is conducted at the temperature of about 600 to 800° C.

9. The method according to claim 1, wherein the forming of the sacrificial oxide film forms a sacrificial oxide film having the thickness of about 100 to 200 Å.

10. The method according to claim 1, wherein the gate insulating film is one selected from a group consisting of oxide, oxynitride, and a high dielectric constant layer having a dielectric constant greater than 15.

11. The method according to claim 1, wherein the metal film is one selected from a group consisting of W, WN, Ti, TiN, Mo and Ta.

12. The method according to claim 1, wherein the step of removing a portion of the interlayer insulating film comprises a chemical mechanical polishing or etch back process and further wherein the step of removing a portion of the metal film to expose a surface of the interlayer insulating film comprises a chemical mechanical polishing or etch back process.

* * * * *